United States Patent
Kiviranta

(10) Patent No.: US 10,910,545 B2
(45) Date of Patent: Feb. 2, 2021

(54) SUPERCONDUCTIVE JUNCTION, SUPERCONDUCTING APPARATUS, METHOD OF MANUFACTURING SUPERCONDUCTING JUNCTION AND CONTROL METHOD OF SUPERCONDUCTING JUNCTION

(71) Applicant: TEKNOLOGIAN TUTKIMUSKESKUS VTT OY, Espoo (FI)

(72) Inventor: Mikko Kiviranta, Espoo (FI)

(73) Assignee: TEKNOLOGIAN TUTKIMUSKESKUS VTT OY, Espoo (FI)

( * ) Notice: Subject to any disclaimer, the term of this patent is extended or adjusted under 35 U.S.C. 154(b) by 0 days.

(21) Appl. No.: 16/474,789

(22) PCT Filed: Dec. 28, 2017

(86) PCT No.: PCT/FI2017/050948
§ 371 (c)(1),
(2) Date: Jun. 28, 2019

(87) PCT Pub. No.: WO2018/122461
PCT Pub. Date: Jul. 5, 2018

(65) Prior Publication Data
US 2019/0326502 A1   Oct. 24, 2019

(30) Foreign Application Priority Data
Dec. 30, 2016 (FI) ........................ 20166053

(51) Int. Cl.
*H01L 39/22* (2006.01)
*H01L 39/02* (2006.01)
*H01L 39/24* (2006.01)

(52) U.S. Cl.
CPC .......... *H01L 39/223* (2013.01); *H01L 39/025* (2013.01); *H01L 39/2493* (2013.01)

(58) Field of Classification Search
CPC .. H01L 39/223; H01L 39/025; H01L 39/2493
(Continued)

(56) References Cited
U.S. PATENT DOCUMENTS 5,121,173 A * 6/1992 Wilson .................... H01L 39/22
257/36
6,365,912 B1  4/2002 Booth et al.
(Continued)

FOREIGN PATENT DOCUMENTS

JP    H08-279630    10/1996
JP    2001-127352    5/2001
(Continued)

OTHER PUBLICATIONS

International Search Report for PCT/FI2017/050948, dated Apr. 9, 2018, 3 pages.
(Continued)

*Primary Examiner* — Tong-Ho Kim
(74) *Attorney, Agent, or Firm* — Nixon & Vanderhye P.C.

(57) ABSTRACT

A superconducting junction comprises: a first layer and a second layer of superconducting material; a tunneling layer of insulating material disposed between the first layer and the second layer of the superconducting material; and a layer of thermally conducting, non-superconducting material disposed between the first layer and the second layer of the superconducting material, the non-superconducting layer being in contact with either the first layer or the second layer of superconducting material.

13 Claims, 7 Drawing Sheets

(58) Field of Classification Search
USPC .......................................................... 257/31
See application file for complete search history.

(56) References Cited

U.S. PATENT DOCUMENTS

| 9,324,767 B1 | 4/2016 | Steinbach et al. |
| 2005/0062131 A1 | 3/2005 | Murduck et al. |
| 2008/0070325 A1 | 3/2008 | Tolpygo |
| 2009/0057652 A1 | 3/2009 | Nevirkovets et al. |
| 2015/0043273 A1 | 2/2015 | Naaman et al. |
| 2015/0346291 A1 | 12/2015 | Lanting et al. |

FOREIGN PATENT DOCUMENTS

| JP | 2002-022845 | 1/2002 |
| JP | 2010-101680 | 5/2010 |
| WO | 99/66567 | 12/1999 |

OTHER PUBLICATIONS

Written Opinion of the ISA for PCT/FI2017/050948, dated Apr. 9, 2018, 5 pages.
Search Report for FI20166053, dated Jun. 8, 2017, 2 pages.
Fretto et al., "Nano SNIS Junctions Fabricated by 3D FIB Sculpting for Application to Digital Electronics" in IEEE Transactions on Applied Superconductivity, IEEE, Jun. 2013, vol. 23, No. 3, 4 page.
Drung et al., "Improved Direct-Coupled dc SQUID Read-Out Electronics with Automatic Bias Voltage Tuning" in IEEE Transactions on Applied Superconductivity, IEEE, Mar. 2001, vol. 11, No. 1, pp. 880-883.

\* cited by examiner though the high transient magnetic field may cause the flux traps which may persist for seconds to hours in superconducting temperatures. Fast recovery from the non-superconducting state to the superconducting state is, however, slow which is why the protection on the basis of heating is impractical with currently available means.

SUPERCONDUCTIVE JUNCTION, SUPERCONDUCTING APPARATUS, METHOD OF MANUFACTURING SUPERCONDUCTING JUNCTION AND CONTROL METHOD OF SUPERCONDUCTING JUNCTION

This application is the U.S. national phase of International Application No. PCT/FI2017/050948 filed 28 Dec. 2017, which designated the U.S. and claims priority to FI Patent Application No. 20166053 filed 30 Dec. 2016, the entire contents of each of which are hereby incorporated by reference.

FIELD

The invention relates to a superconductive junction, superconducting apparatus, a method of manufacturing a superconducting junction and a control method of a superconducting junction.

BACKGROUND

Superconducting-Insulator-Superconducting (S-I-S) junctions are also called Josephson junctions. Measurement devices utilizing the S-I-S junctions as detectors suffer from low-frequency noise, which is at least partially related with temperature fluctuations. In prior art, an area of the Josephson junction has been made large, so that fluctuations would average out. The large-area of the Josephson junction, however, is prone to the problem of flux-trapping.

The S-I-S junctions are applied in SQUID magnetometers which may operate with presence of high transient magnetic field (as in low-field Magnetic Resonance Imaging). The S-I-S junctions are sometimes protected against disturbance during the magnetic transient, by heating the SQUID into a non-superconducting state because the high transient magnetic field may cause the flux traps which may persist for seconds to hours in superconducting temperatures. Fast recovery from the non-superconducting state to the superconducting state is, however, slow which is why the protection on the basis of heating is impractical with currently available means.

Hence, there is a need to improve the protection against or alleviation of the temperature related disturbances of the measurement devices utilizing the superconducting S-I-S junctions.

BRIEF DESCRIPTION

The present invention seeks to provide an improvement for devices utilizing S-I-S junctions. According to an aspect of the present invention, there is provided a superconducting junction as specified in claim 1.

According to another aspect of the present invention, there is provided a superconducting apparatus in claim 4.

According to another aspect of the present invention, there is provided a manufacturing method of a superconducting junction in claim 14.

According to another aspect of the present invention, there is provided a control method of a superconducting junction in claim 15.

The invention has advantages. The superconducting junction can be temperature stabilized or its temperature can be controllably varied between superconducting state and non-superconducting state in a fast manner.

LIST OF DRAWINGS

Example embodiments of the present invention are described below, by way of example only, with reference to the accompanying drawings, in which FIG. 1A illustrates an example of a layered structure of a superconducting component from side;

DESCRIPTION OF EMBODIMENTS

The following embodiments are only examples. Although the specification may refer to "an" embodiment in several locations, this does not necessarily mean that each such reference is to the same embodiment(s), or that the feature only applies to a single embodiment. Single features of different embodiments may also be combined to provide other embodiments. Furthermore, words "comprising" and "including" should be understood as not limiting the described embodiments to consist of only those features that have been mentioned and such embodiments may contain also features/structures that have not been specifically mentioned.

It should be noted that while Figures illustrate various embodiments, they are simplified diagrams that only show some structures and/or functional entities. The connections shown in the Figures may refer to logical or physical connections. It is apparent to a person skilled in the art that the described apparatus may also comprise other functions and structures than those described in Figures and text. It should be appreciated that details of some functions, structures, and the signalling used for measurement and/or controlling are irrelevant to the actual invention. Therefore, they need not be discussed in more detail here.

Figure 1A:
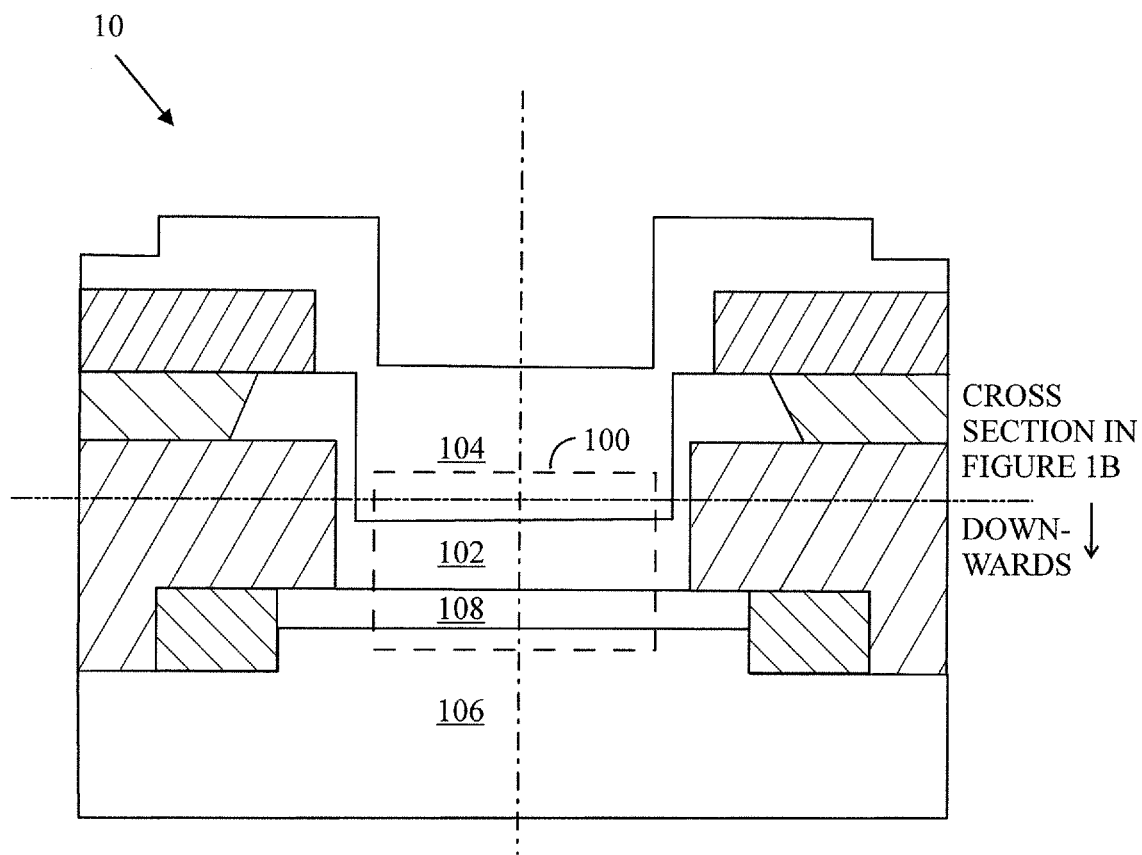
FIG. 1B illustrates an example of a layered structure of a superconducting component from above.
FIG. 1C illustrates an example of a layer of the non-superconducting material within the superconducting junction.
FIG. 1D illustrates another example of a layer of the non-superconducting material within the superconducting junction.
FIG. 1E illustrates still another example of a layer of the non-superconducting material within the superconducting junction.
Figure 1B:
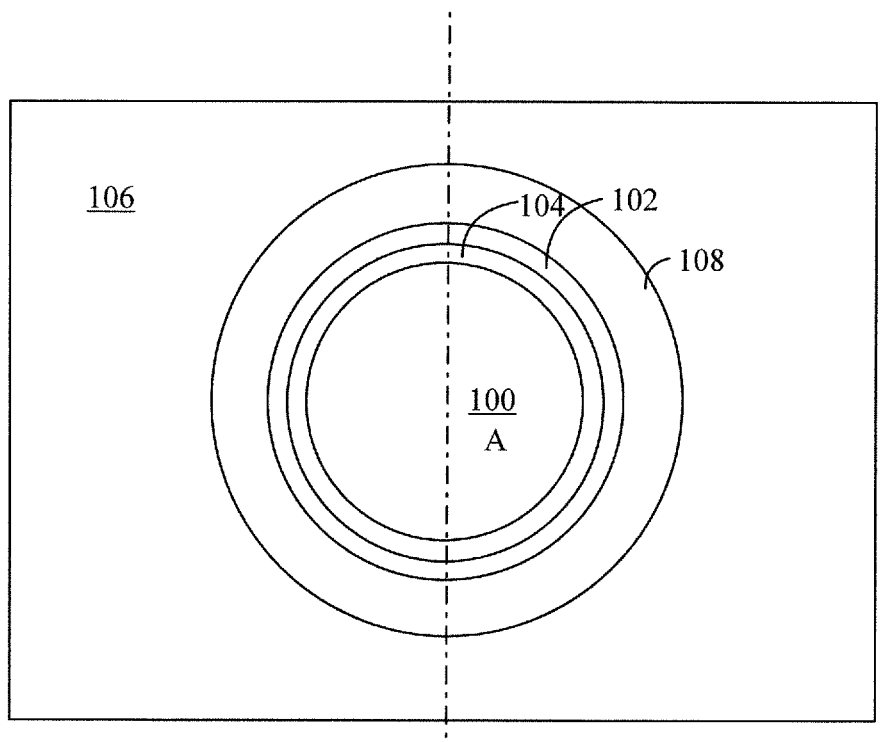
Figure 4:
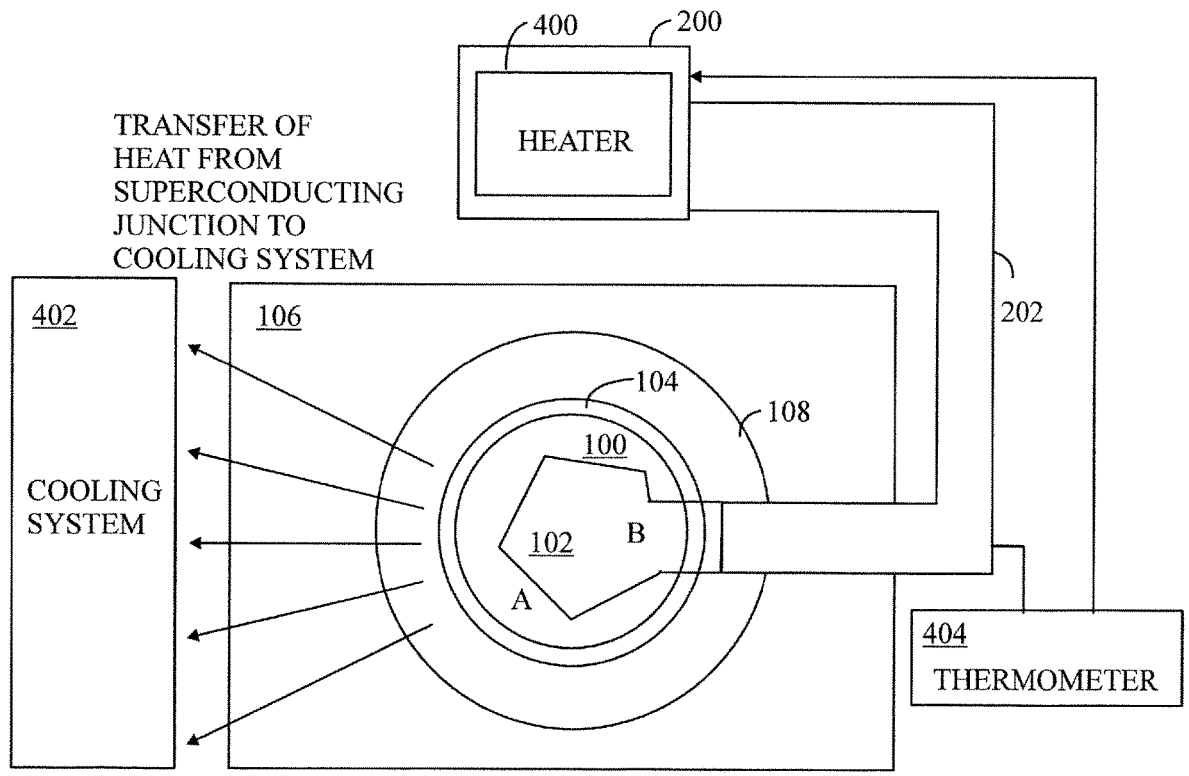
FIG. 4 illustrates an example of a heating and cooling systems for the superconducting junction.

FIGS. 1A and 1B illustrate an example of a layered superconducting component 10. FIG. 1A shows a cross sectional view of the superconducting component 10. FIG. 1B shows a top view of the superconducting component 10 downwards from the level marked with a double-dotted dashed line. In FIG. 1B, only layers 102, 104, 106 and 108 are shown for simplicity. Heating and cooling systems 400, 402 shown in FIG. 4 are used to heat and cool the superconducting junction 100 to a temperature above and/or below a superconducting temperature from outside of the superconducting junction 100. The cooling system 402 is also typically outside the superconducting component 10.

The superconducting junction 100 thus comprises the first layer 104 and the second layer 106 of superconducting material, a tunneling layer 108 of insulating material disposed between the first layer 104 and the second layer 106 of the superconducting material, and the layer 102 of thermally conducting, non-superconducting material disposed between the first layer 104 and the second layer 106 of the superconducting material, the non-superconducting layer 102 being in contact with either the first layer 104 or the second layer 106 of superconducting material.

The superconducting component comprises a superconducting junction 100 which is a new kind of Superconducting-Insulator-Superconducting (S-I-S) junction or a new kind of Josephson junction. The first layer 104 of superconducting material and the second layer 106 of superconducting material may overlap each other at an area A of the superconducting junction 100. The first superconducting layer 104 of the superconducting material and the second layer 106 of the superconducting material are electrically superconducting in a temperature low enough. The first superconducting layer 104 of the superconducting material and the second layer 106 of the superconducting material may provide electric contacts to the superconducting junction 100, and enable an electric current flow to and/or from the superconducting junction 100. The sizes of areas of the superconducting junction 100 and the first superconducting layer 104 may be different from what is drawn in FIGS. 1A and 1B.

The first and second layers 104, 106 of superconducting material may comprise metal, for example. The first and second layers 104, 106 of superconducting material niobium, magnesium diboride and/or aluminum, for example. The thicknesses of the first superconducting layer 104 of the superconducting material and the second layer 106 of the superconducting material may be corresponding to those as in the prior art.

The tunneling layer 108 of insulating material may be an oxide layer such as aluminum oxide, magnesium oxide, niobisiliside or the like, for example. The tunneling layer 108 of insulating material is at least at the superconducting junction 100 but it may also extend to the surroundings of the superconducting junction 100. The thickness and material of the tunneling layer 108 may be corresponding to those as in the prior art.

The layer 102 of non-superconducting material which may poses a property of a superconducting proximity effect. The layer 102 of non-superconducting material is a thermal conductor for thermal control of the superconducting junction 102 within the superconducting junction 100. The layer 102 of the non-superconducting material may be in contact with either of the first layer 104 of the superconducting material or the second layer 106 of the superconducting material. That is, the layer 102 of the non-superconducting material may be between the first layer 104 of the superconducting material and the tunneling layer 108 or between the second layer 106 of the superconducting material and the tunneling layer 108.

The superconducting proximity effect or Holm-Meissner effect refers to a phenomenon where superconductivity is present in a basically non-superconducting material layer such as the layer 102 which is sandwiched between two superconducting material layers i.e. the first and second layers 104, 106. The non-superconducting material layer 102 is typically rather thin, from nanometers to micrometers. The thickness of the non-superconducting material layer 102 which becomes superconductive between the superconducting material layers 104, 106 on the basis of the superconducting proximity effect depends on the material, for example.

Metals typically have a superconducting proximity effect. The non-superconducting layer 102 may include or may be made of titanium tungsten alloy (TiW), copper or the like, for example. The superconducting proximity effect may also be present in non-metals. An example of a non-metal with the superconducting proximity effect is graphene without limiting to this example. Thus, the non-superconducting layer 102 may include or may be made of graphene, for instance.

Figure 1C:
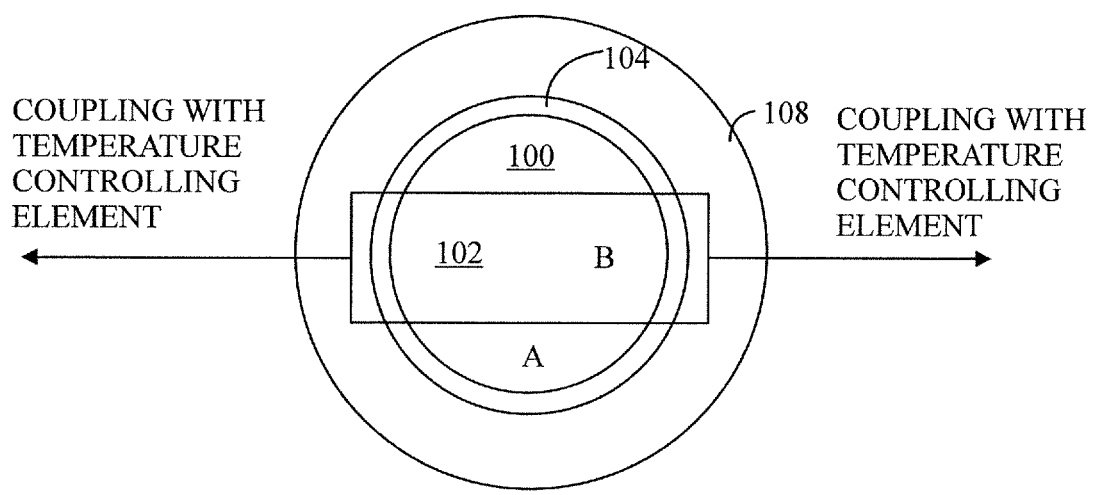
Figure 1D:
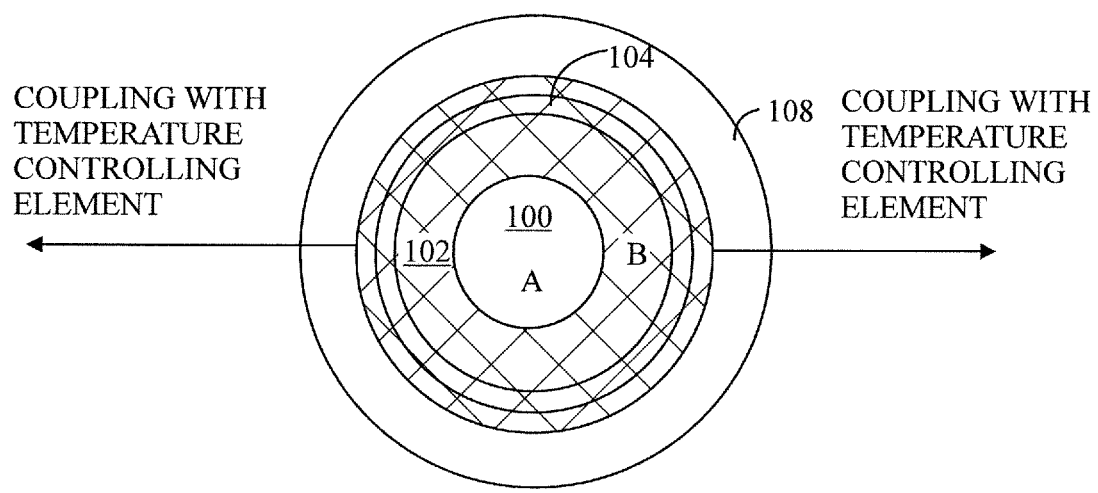
Figure 1E:
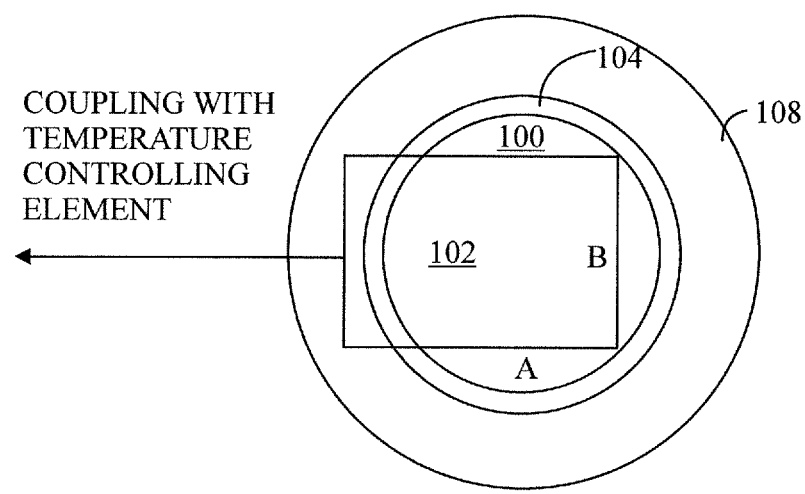

In embodiments examples of which are shown in FIGS. 1C, 1D and 1E, an area B of the layer 102 of the non-superconducting material within the superconducting junction 100 is smaller than a superconducting area A of the superconducting junction 100. The area B of the layer 102 of the non-superconducting material may have a different shape than the area A of the superconducting junction 100. In FIG. 1C the area B of the layer 102 of the non-superconducting material has a shape of a rectangle and the area A of the superconducting junction 100 has a shape of a circle. In FIG. 1D the area B of the layer 102 of the non-superconducting material has a shape of an annulus and the area A of the superconducting junction 100 has a shape of a circle. The annular area B leads to a structure where the central area of the superconducting junction 100 lacks the non-superconducting material. However, the non-superconducting material still exists within the area A of the superconducting junction 100.

FIGS. 1C and 1D illustrates examples where the layer 102 of the non-superconducting material is connected to a temperature controlling element 200 (shown in FIG. 2) at more than one side.

FIG. 1E illustrates an example where the layer 102 of the non-superconducting material is connected to the temperature controlling element 200 at one side. In FIG. 1E, the layer 102 of the non-superconducting material extends outside the superconducting junction 100 only at one side, and on the opposite side the layer 102 of the non-superconducting material ends within the area A of the superconducting junction 100.

The superconducting junction 100 may comprise also other layers, such as hatched layers in FIG. 1A for example, but they are not explained and they should be understood as not limiting the described embodiments. Some of said other layers may comprise silicon dioxide, for example.

Figure 2:
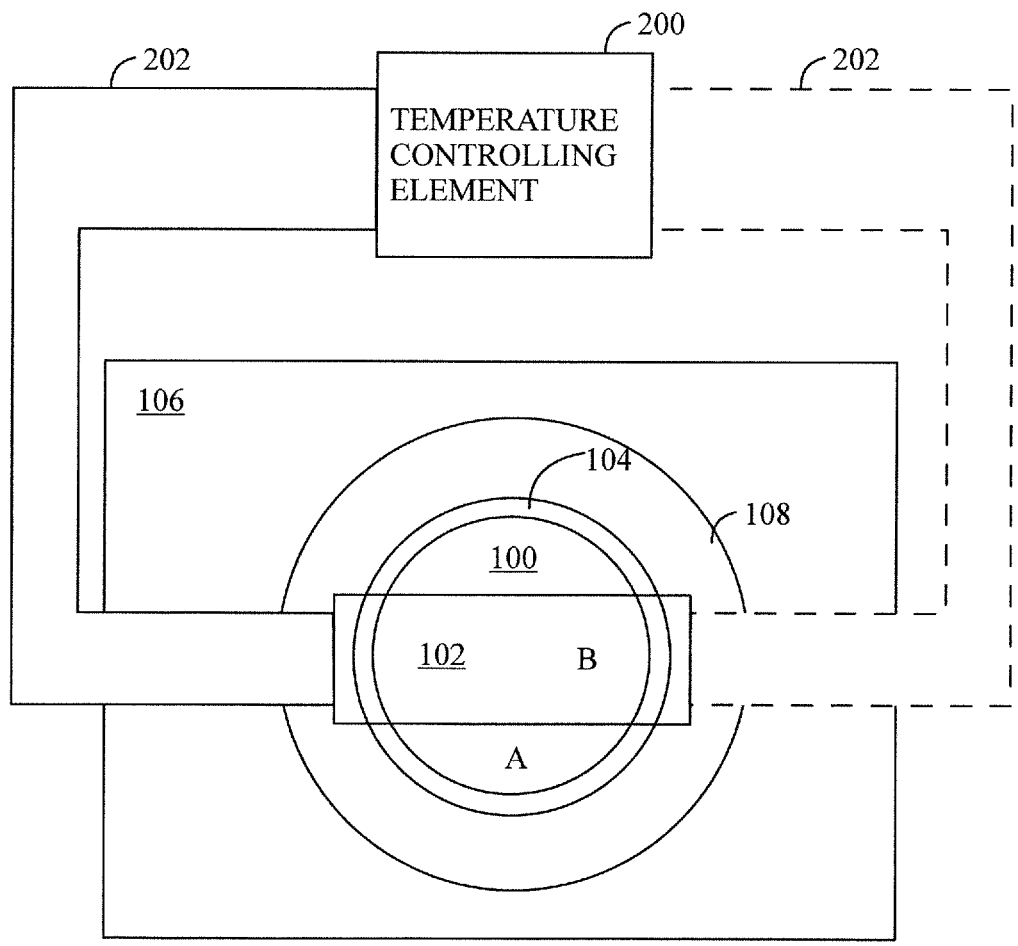
FIG. 2 illustrates an example of a temperature controlling element for the superconducting junction.
Figure 3:
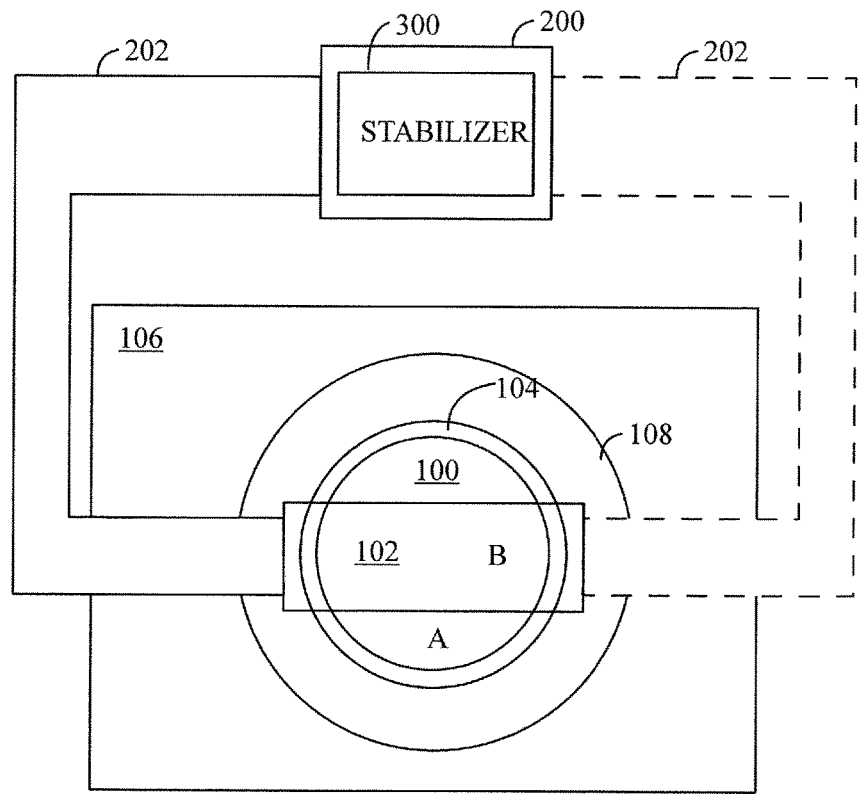
FIG. 3 illustrates an example of a temperature stabilizer for the superconducting junction.

FIG. 2 illustrates an example of a superconducting apparatus, which may refer to the superconducting component 10 or the like, and which may comprise the superconducting junction 100. Additionally, the superconducting apparatus may comprise a temperature controlling element 200 outside of the superconducting junction 100. In an embodiment, the temperature controlling element 200 may be outside the superconducting component 10. In an embodiment, the temperature controlling element 200 may be inside the superconducting component 10.

The temperature controlling element 200 is coupled with the layer 102 of the non-superconducting material for controlling the temperature of the superconducting junction 100. In an embodiment, at least one thermal conductor 202 coupling the layer 102 of the non-superconducting material within the superconducting junction 100 and the temperature controlling element 200 together may include the non-superconducting material of the layer 102. In an embodiment, the thermal conductor 202 coupling the layer 102 of the non-superconducting material within the superconducting junction 100 and the temperature controlling element 200 together may include non-superconducting material different from that of the layer 102. In general, the thermal conductor 202 may be metal. The thermal conductor 202 may be coupled with the layer 102 of the non-superconducting material within the superconducting junction 100 at least at one side. FIG. 2 shows two thermal conductors 202 where one of the thermal conductors 202 may or may not be present and that is why it is drawn with a dashed line.

In an embodiment, the thermal conductor 202 may be realized by letting the non-superconducting material of the layer 102 of extend from the superconducting junction 100 outside up to the temperature controlling element 200.

In an embodiment, the temperature controlling element 200 may comprise a stabilizer 300 which has a higher heat capacity than that of the layer 102 of the non-superconducting material at the superconducting junction 100. The heat capacity C is measured by dividing heat (energy) Q by temperature change $\Delta T$, i.e. $C=Q/\Delta T$. The stabilizer 300 may be set in a desired temperature for keeping temperature of the layer 102 of the non-superconducting material, which is operationally coupled with the stabilizer 300, within a first temperature range 800 (see FIG. 8A) and for keeping a temperature of the superconducting junction 100 within a second temperature range 802 (see FIG. 8A, 8B). The second temperature range 802 depends on the first temperature range 800 and in practice they can be considered the same. Irrespective of breadths of the first and second temperature ranges, temperature fluctuations at the superconducting junction 100 can be limited or stabilized on the basis of thermal inertia of the stabilizer 300 and good thermal conductivity of the at least one thermal conductor 202. The first and second temperature ranges are desired temperature ranges which can be determined by a person skilled in the art on the basis of requirements and materials.

The thermal conductance of the thermal conductor 202 transmits the heat from the layer 102 of the non-superconducting material to the stabilizer 300 or from the stabilizer 300 to the thermal conductor 202. The layer 102 of the non-superconducting material, in turn, transmits heat from the superconducting junction 100 the thermal conductor 202 or from the thermal conductor 202 to the superconducting junction 100.

The first desired temperature range and the second desired temperature range may be different. The first desired temperature range and the second desired temperature range may be overlapping at least partially. The first desired temperature range and the second desired temperature range may be the same. In an embodiment, the stabilizer 300 is set in a desired temperature for keeping a temperature of the layer 102 of the non-superconducting material constant and for keeping a temperature of the superconducting junction 100 constant. The constant temperature of the layer 102 of the non-superconducting material and the superconducting junction 100 may be different. The constant temperature of the layer 102 of the non-superconducting material and the superconducting junction 100 may be the same.

For example, SQUID magnetometers suffer from low-frequency noise, which is at least partially related with temperature fluctuations. The gap voltage and other properties of the superconducting junction 100 depend on its temperature, and the properties may be affected by local temperature fluctuations. Sometimes it is useful to control the junction parameters, too, by intentional temperature changes. Thermal control of the Josephson junctions is difficult, however, because they are typically buried inside thermally-isolating insulation layers, and because superconducting metal itself is a poor heat conductor. The use of S-N(S)-I-S junctions in SQUIDs instead of the traditional S-I-S junctions, where N(S) denotes the layer 102 of the non-superconducting material driven superconductive by the proximity effect in the vicinity of the superconductive electrodes 104, 106, eliminates or alleviates the temperature fluctuations of the superconducting junction 100. The layer 102 of the non-superconducting material, which may be of normal metal or other heat conductor, provides a well-conducting thermal link coupled with the stabilizer 300, which allows temperature control of the superconducting junction 100.

In low-field MRI (Magnetic Resonance Imaging), the superconducting layers 104, 106 of the superconducting junction 100 can be kept narrow, which alleviate flux-trapping, and still the low-frequency noise may be eliminated or kept moderate with the temperature stabilization.

In an embodiment a simplified example of which is illustrated in FIG. 4, the temperature controlling element 200 may comprise a heater 400 which may provide heating power to heat, for a first period 700 of time (see FIG. 7), the layer 102 of the non-superconducting material to a temperature higher than a highest temperature at which the superconducting junction 100 is superconducting. The layer 102 of the non-superconducting material transfers the heat to the first superconducting layer 104 and the second superconducting layer 106 which causes their temperature to rise. The rise in temperature, in turn, causes the first superconducting layer 104 and the second superconducting layer 106 to become non-superconducting for a second period 702 (see FIG. 7). The heater 400 may output more heat energy for the superconducting junction 102 during the first period 700 than is consumed by heat loss in the one or more thermal conductors 202 and the cooling system 402. The cryogenic cooling of the cooling system 402 may be based on liquid helium, for example. The liquid helium may surround the component 10 but is not necessarily in direct contact with the superconducting junction 100. The heater 400 and the stabilizer 300 may be used alternatively or together for having a proper thermal control of the superconducting junction 100.

The first and second periods 700, 702 may be the same but because of a potential difference in thermal inertias between the superconductive junction 100 and the layer 102 of the non-superconductive material, there may a temporal difference. The first and second periods 700, 702 may be temporally overlapping. The superconducting junction 100 is superconductive outside the second period 702 on the basis of cooling power from a cooling system 402 outside the superconductive junction 100.

Because the volume of the layer 102 of the non-superconducting material is much smaller in the superconducting junction 100 than a whole detector or the component 10 and/or because the thermal contact of the layer 102 to the junction 100 is good, the superconducting junction 100 can effectively and quickly be heated up and cooled down. In the prior art, the whole detector or the component 10, which is a large object compared to the superconducting junction 100 alone, is heated up and it takes a long time to cool it down. By controlling the temperature of the superconducting junction 100 from within the junction directs the heating and cooling to an essential and small volume without changing temperatures in operationally unnecessary areas in the detector or the component 10. This reduces the thermal inertia and quickens both the heating and cooling of the superconducting junction 100. In this manner, it is possible, depending on the size of the superconducting junction 100, to switch between the superconducting state and the non-superconducting state of the junction 100 in a range 1 ms to 50 ms in the fastest manner. By making the superconducting junction 100 very small, the state of the superconducting junction 100 may be changed from superconducting to non-superconducting or vice versa faster than 1 ms. Naturally, the state of the superconducting junction 100 may also be changed slower than the fastest times above in a controllably manner.

In an embodiment, the temperature controlling element 200 may comprise or may operationally be coupled with a thermometer 404 which may measure a temperature of the layer 102 of non-superconducting material. The temperature controlling element 200 may receive information about the measured temperature from the thermometer 404 and increase, keep or decrease the heating power of the heater 400 in response to the information about the measured temperature. The state of the superconducting junction 100 may also be changed in a controllably manner by following the temperature data of the thermometer 404.

In general, the area A of the superconducting junction 100 can be temperature-stabilized either by a large thermal body 300 or using an active temperature control provided by the heater 400 and the thermometer 404.

Figure 5:
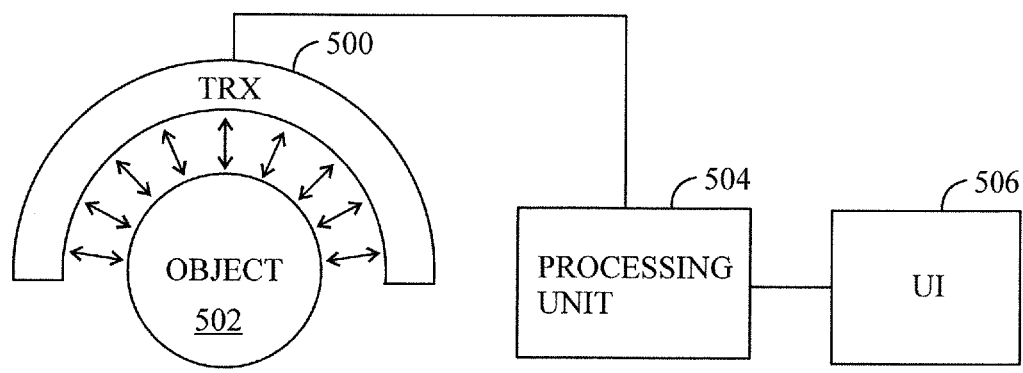
FIG. 5 illustrates an example of a magnetic resonance imaging machine.

FIG. 5 illustrates an example of an MRI (Magnetic Resonance Imaging) machine. The MRI machine, which may be combined with magnetoencephalography technology, and its use, per se, are known by a person skilled in the art and that is why they don't need to be explained in detail. The prepolarization field may be about 0.1 T and the working field may be about 100 µT, for example. The MRI machine may have a closed or open tube. A transmitter-receiver 500 has an electro-magnet which outputs at least one magnetic pulse to an object 502 for one measurement. The transmitter-receiver 500 also has a transmitter which transmits varying magnetic field, which may be in kilohertz range. Both the magnetic pulses and the varying magnetic field are transmitted under the control of a processing unit 504 which may be a computer. The processing unit 504, in turn, may be controlled by a doctor or other professional staff using a user interface 506 which may include a display and a keyboard. In an embodiment, the display may be a touch panel with or without a keyboard.

Alternating magnetic field signals are received, under the control of the processing unit 504, in response to the transmissions of the transmitter-receiver 500 from the object 502 by the transmitter-receiver 500 which has a plurality of the components 10 as detectors with the superconducting junctions 102 in a cryostatic temperature range. The alternating magnetic field signals detected using the superconducting junctions 102 may be used to form an image of the object 502 and the image may be used to diagnose a variety of good or bad conditions of the object 502. Often the object 502 is the brain and/or a part of a spinal cord. Still, whole body or some other body part of a person or animal may be scanned with the MRI machine.

The processing unit 504 may control the heater 400 of the temperature controlling element 200 to heat the superconducting junctions 102 of the transmitter-receiver 500 into a non-superconducting state before, at or after the at least one magnetic pulse of one measurement output by the transmitter-receiver 500. The processing unit 504 may control the heater 400 of the temperature controlling element 200 to stop heating after the magnetic pulses output by the transmitter-receiver 500. That is, each superconducting junction 102 is in the non-superconducting state between the at least one magnetic pulse of one measurement and the detection, where the detection is based on or performed after said at least one magnetic pulse using the at least one superconducting junction 100. Additionally, the heater 400 stops heating the at least one superconducting junction 100 before the detection for allowing the at least one superconducting junction 100 return to the superconducting state for the detection.

The structures around the superconducting junctions 102 are constantly in a temperature range where the first and second layers 104, 106 would be superconducting, because the heater 400 heats only the superconducting junction 100 to a temperature associated with the non-superconducting state. The structures around the superconducting junctions 102 are also constantly cooled by the cooling system 402 which keeps the directly adjacent surroundings of each of the superconducting junctions 102 in a temperature range below the threshold between the superconducting state and the non-superconducting state of the first and second layers 104, 106. When the heater 400 stops producing heat, the first and second layers 104, 106 and the whole superconducting junction 100 cool quickly and reach the superconducting state fast for enabling detection of the alternating magnetic fields coming from the body part 502 by each of the superconducting junctions 102. The change from non-superconducting state to the superconducting state is quicker than in the prior art, because the volume of the first and second layers 104, 106 and the whole superconducting junction 100 is small compared to whole component 10, and because the heat of each of the superconducting junctions 102 produced by the heater 400 is quickly absorbed by the colder surroundings and the cooling system 402.

Figure 6:
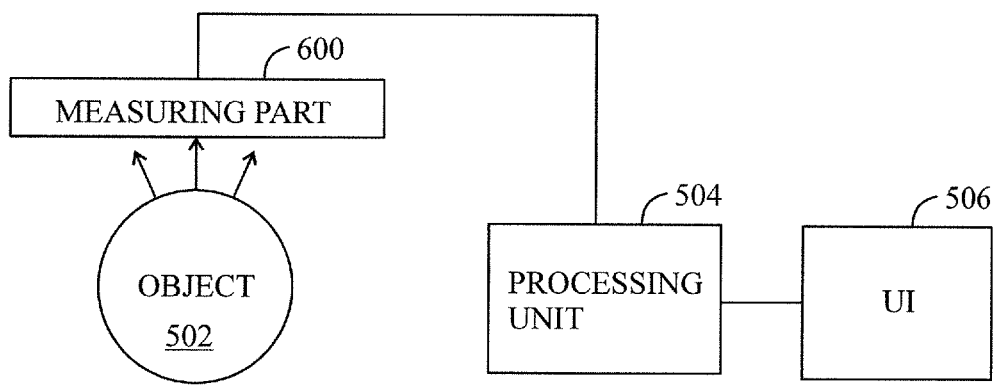
FIG. 6 illustrates an example of a magnetoencephalography machine.

FIG. 6 illustrates another example of the magnetoencephalography (MEG) machine. The MEG machine may be based on SQUID (Superconducting Quantum Interference Device). The measuring part 600 comprises a plurality of the superconducting junctions 100 for detecting magnetic fields of the object 502 such as a head with the brain. The stabilizer 300 may keep the temperature of the plurality of superconducting junctions 100 stabilized within the second temperature range 802.

The heater 400 of the temperature controlling element 200 may start or increase heating in response to the information about the measured temperature which is measured with the thermometer 404 and which decreasing. The heater 400 of the temperature controlling element 200 may stop or decrease heating in response to the information about the measured temperature which is increasing.

Figure 7:
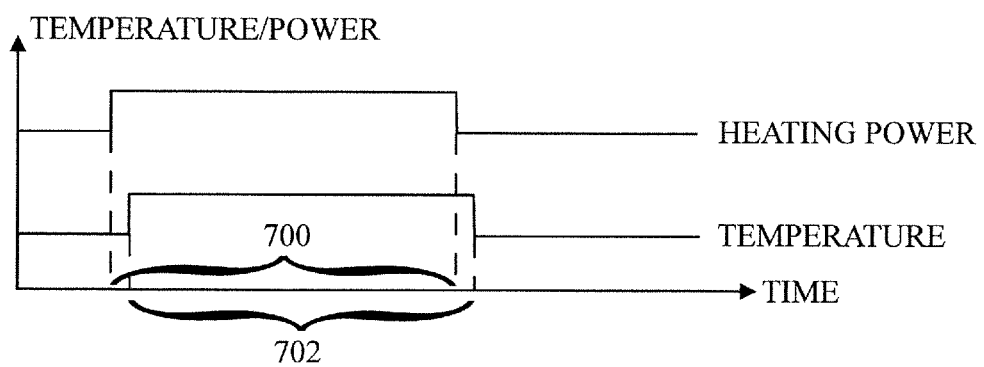
FIG. 7 illustrates an example of periods of heating and the heated superconducting junction.

FIG. 7 illustrates an example of a period of time of heating and a period of time in the non-conducting state of the superconducting junction 100. The vertical axis refers to temperature and power of heating. The horizontal axis refers to time. Both axes are in arbitrary scale. During the first period 700 the heater produces heat. Because of a potential delay, the superconductive junction 100 is in non-superconductive state during the second period 702 in response to the heating during the first period 700.

Figure 8A:
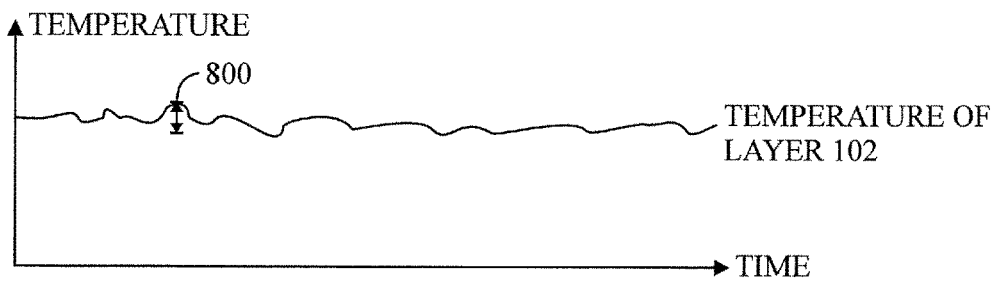
FIG. 8A illustrates an example of temperature fluctuation within a temperature range enabling a superconducting state.

FIG. 8A illustrates an example of variation of temperatures of the layer 102 of the non-superconducting material. The vertical axis refers to temperature. The horizontal axis refers to time. Both axes are in an arbitrary scale. The temperature of the superconducting junction 100 follows the temperature of the layer 102 of the non-superconducting material i.e. is in practice the same as the temperature of the layer 102 of the non-superconducting material. The temperature fluctuation of the layer 102 of the non-superconducting material may be considered to stay in the first range 800 if the stabilizer 300 is used. In reality, the temperature fluctuation is attenuated with the stabilizer such that there is a high probability that the temperature is cool enough for the superconducting junction 100 to be in a superconducting state. The temperature of the stabilizer 300 may be equal to the superconducting junction 100. However, it is also possible that no stabilizer 300 is used. Then it is enough that the layer 102 is kept in a temperature below which the superconducting junction 100 is superconducting without paying attention to the temperature fluctuation.

Figure 8B:
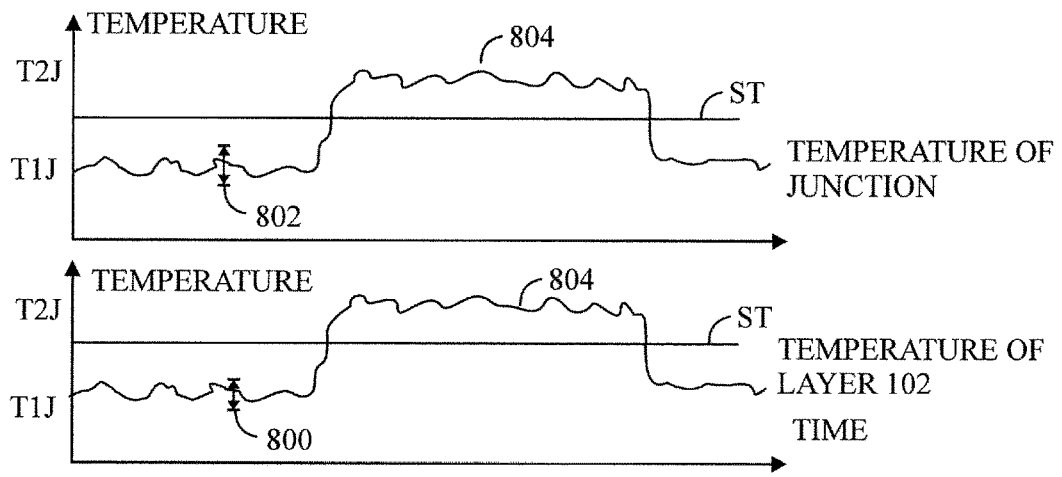
FIG. 8B illustrates example temperature fluctuation inside and outside a superconducting state.

FIG. 8B illustrates examples of variation of temperatures of the layer 102 of the non-superconducting material and the superconducting junction 100 when the stabilizer 300 is used. The vertical axes of both diagrams refer to temperature. The horizontal axes refer to time. The axes are in arbitrary scales. The horizontal line ST refers to a temperature below which the superconducting junction 100 is superconducting and above which the superconducting junction 100 is non-superconducting. The temperature fluctuation of the layer 102 of the non-superconducting material is in the first range 800. The temperature fluctuation of the superconducting junction 100 is in the second range 802. The ranges 800 and 802 may be the same in reality. The second range 802 of the temperature fluctuation of the superconducting junction 100 can be kept low with the stabilizer 300 when the superconducting junction 100 is kept in the superconducting state. When the superconducting junction 100 is kept in the superconducting state by keeping the temperature below ST, it is not necessary to keep the temperature fluctuation in any specific range, although it may be done. By heating the SQUID into a non-superconducting state during a thermal pulse 804 it is possible to prevent the situation where the high transient magnetic field during the thermal pulse 804 causes the persistent flux traps, because the flux traps are only generated in a superconducting state. In a similar manner, when the superconducting junction 100 is kept in the non-superconducting state by keeping the temperature above ST, it is not necessary to keep the temperature fluctuation in any specific range, although it may be done.

Figure 9:
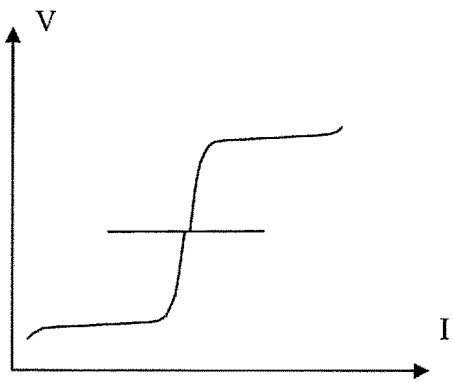
FIG. 9 illustrates an example of characteristics of a superconducting junction in liquid helium.

FIG. 9 illustrates a measurement of a hysteresis curve of the superconducting junction 100 in liquid helium. The vertical axis denotes voltage over the superconducting junction 100 and the horizontal axis denotes current through the superconducting junction 100.

Figure 10:
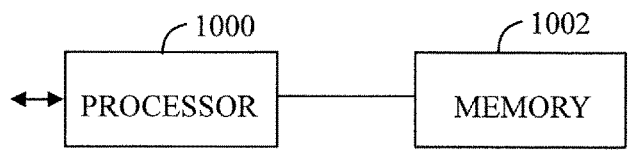
FIG. 10 illustrates an example of a processing unit with at least one processor and at least one memory.

FIG. 10 illustrates an example of the processing unit 504 which may comprise one or more processors 1000 and one or more memories 1002 including a computer program code. The one or more memories 1002 and the computer program code configured to, with the one or more processors 1000, cause the apparatus at least to control the heater 400 to heat and stop heating.

In an embodiment, the one or more memories 1002 and the computer program code may, with the one or more processors 1000, cause apparatus at least to control the heater 400 on the basis of the information about the temperature measured by the thermometer 404.

In low-field MRI, the SQUID can be protected by heating every superconducting junction 100 into a non-superconducting state, and still obtain fast recovery back to the superconducting state.

The superconducting junctions 102 may be applied in medical low-field MRI or where-ever low-frequency noise in Josephson junctions causes problems. Possible applications may be related to magnetoencephalography, magnetotellurics in ore prospecting, quantum information processing, gain stabilization for detector-readout amplifiers.

Figure 11:
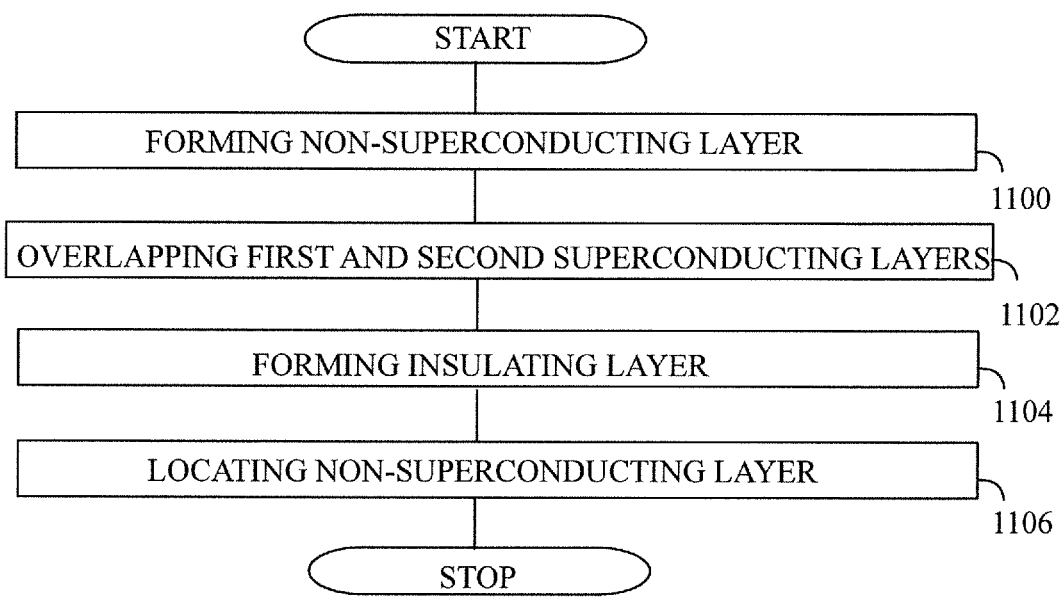
FIG. 11 illustrates an example of a flow chart of a manufacturing method of a superconducting junction.

FIG. 11 is a flow chart of the manufacturing method. In step 1100, a layer 102 of thermally conducting, non-superconducting material is formed between a first layer 104 and a second layer 106 of the superconducting material, the non-superconducting layer 102 being in contact with either the first layer 104 or the second layer 106 of superconducting material. In step 1104, a tunneling layer 108 of insulating material is formed between the first layer 104 and the second layer 106 of the superconducting material.

FIG. 11 illustrates more detailed manufacturing steps. In step 1100, the layer 102 of non-superconducting and thermally conducting material with a superconducting proximity effect may be formed between the first layer 104 of superconducting material and the second layer 106 of superconducting material.

In step 1102, the first layer 104 of superconducting material and second layer 106 of superconducting material may be overlapped with each other at a superconducting junction 100, the first layer 104 of superconducting material and second layer 106 of superconducting material providing electric contacts the superconducting junction 100.

In step 1106, the non-superconducting layer 102 of the non-superconducting material may be located in contact with either of the first layer 104 of the superconducting material or the second layer 106 of the superconducting material for allowing thermal control of the superconducting junction 102 with the layer 102 of non-superconducting material.

When manufacturing the superconducting junction and apparatus a "trilayer" may be formed first. That is, the second layer 106 of the superconducting material may be covered with the tunneling layer 108. During this phase, also at least one (superconducting) layer which is not numbered and which is beside and/or on the tunneling layer 108 may be added (see FIG. 1A). Then the non-superconducting layer 102 of the non-superconducting material may be formed on the tunneling layer 108. Finally, the first layer 104 of the superconducting material may be formed on the non-superconducting layer 102 of the non-superconducting material.

In an alternative way, it may be possible to grow the non-superconducting layer 102 of the non-superconducting material directly on the tunneling layer 108 without the at least one unnumbered superconducting layer (see FIG. 1A). In a still alternative way, it may be possible to grow the non-superconducting layer 102 of the non-superconducting material on the second layer 106 of the superconducting material, and after that it may be possible to form the tunneling layer 108 thereon.

Figure 12:
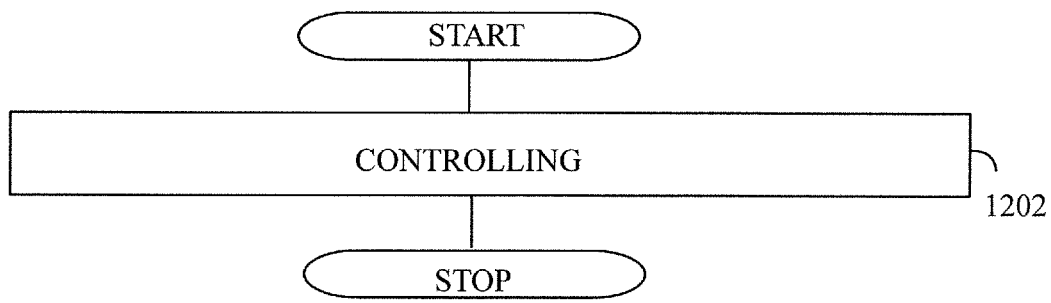
FIG. 12 illustrates an example of a flow chart of a control method of a superconducting junction.

FIG. 12 is a flow chart of the control method. In step 1200, temperature of a superconducting junction 100 is controlled by conducting heat to and/or from a superconducting junction 100 with a thermally conductive layer 102 of non-superconducting and thermally conductive material, the layer 102) of non-superconducting material and a tunneling layer 108 of insulating material being between a first layer 104 of superconducting material and a second layer 106 of superconducting material.

In more detail of step 1200, temperature of a superconducting junction 100 may be controlled by conducting heat to and/or from a superconducting junction 100 with a thermally conductive layer 102 of non-superconducting and thermally conductive material which possesses a superconducting proximity effect, the layer 102 of non-superconducting material and a tunneling layer 108 of insulating material being between a first layer 104 of superconducting material and a second layer 106 of superconducting material which overlap each other at the superconducting junction 100 and provide electric contacts the superconducting junction 100, and the layer 102 of the non-superconducting material being in contact with either of the first layer 104 of the superconducting material or the second layer 106 of the superconducting material.

The method shown in FIG. 12 may be implemented as a logic circuit solution or computer program. The computer program may be placed on a computer program distribution means for the distribution thereof. The computer program distribution means is readable by a data processing device, and it encodes the computer program commands, carries out the measurements and optionally controls the processes on the basis of the measurements.

The computer program may be distributed using a distribution medium which may be any medium readable by the controller. The medium may be a program storage medium, a memory, a software distribution package, or a compressed software package. In some cases, the distribution may be performed using at least one of the following: a near field communication signal, a short distance signal, and a telecommunications signal.

It will be obvious to a person skilled in the art that, as technology advances, the inventive concept can be implemented in various ways. The invention and its embodiments are not limited to the example embodiments described above but may vary within the scope of the claims.

The invention claimed is:

1. A superconducting apparatus, wherein the superconducting apparatus comprises
   a superconducting junction comprising:
     a first layer and a second layer of superconducting material;
     a tunneling layer of insulating material disposed between the first layer and the second layer of the superconducting material; and
     a layer of thermally conducting, non-superconducting material disposed between the first layer and the second layer of the superconducting material, the non-superconducting layer being in contact with either the first layer or the second layer of superconducting material; and
   a temperature controlling element outside of the superconducting junction, the temperature controlling element being coupled with the layer of the non-superconducting material for controlling the temperature of the superconducting junction.

2. The superconducting apparatus of claim 1, wherein the non-superconducting material of the non-superconducting layer is configured to extend outside the superconducting junction.

3. The superconducting apparatus of claim 1, wherein the temperature controlling element comprises a stabilizer which is configured to have a higher heat capacity than that of the layer of the non-superconducting material at the superconducting junction, and the stabilizer is configured to limit temperature fluctuation of the superconducting junction.

4. The superconducting apparatus of claim 3, wherein the apparatus comprises a measuring part, the measuring part comprising a plurality of the superconducting junctions for detecting magnetic fields of the object; and
   the stabilizer is configured to keep the temperature of the plurality of superconducting junctions stabilized within the second temperature range.

5. The superconducting apparatus of claim 1, wherein the temperature controlling element comprises a heater configured to provide heating power to heat, for a first period, the layer of the non-superconducting material to a temperature where the superconducting junction is non-superconducting for a second period, and the superconducting junction is configured to be superconductive outside the second period on the basis of cooling power from a cooling system outside the superconductive junction.

6. The superconducting apparatus of claim 5, wherein the apparatus comprises a transmitter-receiver for transmitting at least one magnetic pulse and varying magnetic field to an object for one measurement, the transmitter-receiver comprising at least one of the superconducting junctions for detecting alternating magnetic field transmitted from the object in response to the transmissions to the object; and
   the heater is configured to heat the at least one superconducting junction to a temperature where the superconducting junction is non-superconducting between the at least one magnetic pulse and a detection, the detection being based on said at least one magnetic pulse using the at least one superconducting junction; and
   the heater is configured to stop heating the at least one superconducting junction before the detection for allowing the at least one superconducting junction return to the superconducting state for the detection.

7. The superconducting apparatus of claim 6, wherein the apparatus comprises a processing unit with
   one or more processors; and
   one or more memories including computer program code;
   the one or more memories and the computer program code configured to, with the one or more processors, cause apparatus at least to:
   control the heater to heat and stop heating.

8. The superconducting apparatus of claim 7, wherein the one or more memories and the computer program code are configured to, with the one or more processors, cause apparatus at least to:
   control the heater on the basis of the information about the temperature measured by the thermometer.

9. The superconducting apparatus of claim 1, wherein the temperature controlling element comprises or is operationally coupled with a thermometer which is configured to measure a temperature of the layer of non-superconducting material, and the temperature controlling element is configured to receive information about the measured temperature and start, increase, keep, decrease or stop the heating power in response to the information about the measured temperature.

10. The superconducting apparatus of claim 9, wherein the heater of the temperature controlling element is configured to start or increase heating of the layer of the non-superconducting material for heating the superconducting junction in response to the information about the measured temperature which is decreasing; and
   the heater of the temperature controlling element is configured to stop or decrease heating of the layer of the non-superconducting material for cooling the superconducting junction in response to the information about the measured temperature which is increasing.

11. The superconducting apparatus of claim 1, wherein the layer of non-superconducting material with a superconducting proximity effect is in contact with either of the first layer of the superconducting material or the second layer of the superconducting material for thermal control of the superconducting junction within the superconducting junction;

the first layer of superconducting material and the second layer of superconducting material overlapping each other at the superconducting junction and being configured to provide electric contacts the superconducting junction.

12. The superconducting apparatus of claim 1, wherein an area of the layer of the non-superconducting material within the superconducting junction is smaller than a superconducting area of the superconducting junction.

13. A control method of a superconducting junction, the method comprising controlling temperature of a superconducting junction by conducting heat to and/or from a superconducting junction with a thermally conductive layer of non-superconducting and thermally conductive material, the layer of non-superconducting material and a tunneling layer of insulating material being between a first layer of superconducting material and a second layer of superconducting material.

\* \* \* \* \*